US009373710B2

(12) United States Patent
Van Treek et al.

(10) Patent No.: US 9,373,710 B2
(45) Date of Patent: Jun. 21, 2016

(54) INSULATED GATE BIPOLAR TRANSISTOR (71) Applicant: Infineon Technologies AG, Neubiberg (DE)

(72) Inventors: Vera Van Treek, Unterhaching (DE); Frank Pfirsch, Munich (DE); Roman Baburske, Otterfing (DE); Franz-Josef Niedernostheide, Hagen a.T.W. (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/278,519

(22) Filed: May 15, 2014

(65) Prior Publication Data

US 2015/0333161 A1    Nov. 19, 2015

(51) Int. Cl.
*H01L 29/66* (2006.01)
*H01L 29/739* (2006.01)
(Continued)

(52) U.S. Cl.
CPC ........ *H01L 29/7395* (2013.01); *H01L 29/0623* (2013.01); *H01L 29/1095* (2013.01)

(58) Field of Classification Search
CPC .................. H01L 29/7397; H01L 29/7395
See application file for complete search history.

(56) References Cited

U.S. PATENT DOCUMENTS 5,283,201 A    2/1994  Tsang et al.
7,329,627 B2   2/2008  Wanninger et al.
(Continued)

FOREIGN PATENT DOCUMENTS

DE    10252103 A1    5/2004
DE    10360574 A1    7/2005
DE    10085054 B4    12/2005

OTHER PUBLICATIONS

Nakagawa, et al., "MOSFET-mode Ultra-Thin Wafer PTIGBTs for Soft Switching Application Theory and Experiments", Proceedings of 2004 International Symposium on Power Semiconductor Devices and ICs, pp. 103-106.

*Primary Examiner* — Thao X Le
*Assistant Examiner* — Laura Dykes
(74) *Attorney, Agent, or Firm* — Murphy, Bilak & Homiller, PLLC (57) ABSTRACT

A semiconductor component is described herein. In accordance with one example of the invention, the semiconductor component includes a semiconductor body, which has a top surface and a bottom surface. A body region, which is doped with dopants of a second doping type, is arranged at the top surface of the semiconductor body. A drift region is arranged under the body region and doped with dopants of a first doping type, which is complementary to the second doping type. Thus a first pn-junction is formed at the transition between the body region and the drift region. A field stop region is arranged under the drift region and adjoins the drift region. The field stop region is doped with dopants of the same doping type as the drift region. However, the concentration of dopants in the field stop region is higher than the concentration of dopants in the drift region. At least one pair of semiconductor layers composed of a first and a second semiconductor layer are arranged in the drift region. The first semiconductor layer extends substantially parallel to the top surface of the semiconductor body and is doped with dopants of the first doping type but with a higher concentration of dopants than the drift region. The second semiconductor layer is arranged adjacent to or adjoining the first semiconductor layer and is doped with dopants of the second doping type. Furthermore, the second semiconductor layer is structured to include openings so that a vertical current path is provided through the drift region without an intervening pn-junction.

17 Claims, 5 Drawing Sheets

(51) Int. Cl.
*H01L 29/06* (2006.01)
*H01L 29/10* (2006.01)

(56) References Cited

U.S. PATENT DOCUMENTS

| | | |
|---|---|---|
| 7,709,887 B2 | 5/2010 | Hille et al. |
| 7,989,888 B2 | 8/2011 | Schulze et al. |
| 8,269,270 B2 | 9/2012 | Mauder et al. |
| 2004/0151647 A1 | 8/2004 | Wanninger et al. |
| 2005/0133857 A1 | 6/2005 | Mauder et al. |
| 2007/0114598 A1* | 5/2007 | Hotta .................. H01L 29/0619 257/330 |
| 2008/0173876 A1* | 7/2008 | Ueno ............................. 257/77 |
| 2011/0101416 A1* | 5/2011 | Schulze .............. H01L 29/0834 257/139 |
| 2013/0092978 A1* | 4/2013 | Sugawara et al. ............. 257/139 |

* cited by examiner

INSULATED GATE BIPOLAR TRANSISTOR

TECHNICAL FIELD

The present disclosure relates to the field of insulated gate bipolar transistors (IGBTs) having an improved short circuit robustness.

BACKGROUND

Vertical insulated gate bipolar transistors (IGBTs) which are composed of a plurality of transistor cells connected in parallel are known in the field of power semiconductor components. In such vertical IGBTs the electron current flows through the semiconductor die in a vertical direction from a top surface (or front side surface) to a bottom surface (or back side surface) of the semiconductor die, whereas hole current flows in the opposite direction. In case of an n-channel IGBT, a p-doped collector region (also referred to as p-emitter region in case of n-channel IGBTs) is located at the back side of the semiconductor die, where it is electrically connected to the collector electrode. A p-doped body region and an n-doped source region are disposed at the front side of the semiconductor die in each transistor cell, whereby the both regions of each individual transistor cells are connected to the emitter electrode. It is further known to provide a so-called field stop region, which adjoins the p-doped collector region at the back side of the semiconductor die. The field stop region is doped with dopants of the opposite doping type than the collector region. Furthermore, the concentrations of dopants in the field stop zone is significantly higher than in the so-called drift region which extends through the semiconductor die from the field stop region at the back side of the die to the body region at the front side of the die.

Generally field stop regions may be provided, for example, in semiconductor components which have, in an off-state, a vertical pnp-structure with a blocking pn-junction (between body region and drift region) at the front side of the semiconductor die. When the applied blocking voltage is so high that the electric field (or the space charge region, also referred to as depletion region) would extend down to the back side of the semiconductor die, then the mentioned field stop region is needed to avoid a "punch-through" of the electric field which would result in a breakdown of the transistor. The field stop region is somewhat more heavily doped than the neighboring drift region, and reduces the electric field at the back side of the semiconductor die and avoids the mentioned punch-through.

A peak of the electric field can occur in the field stop region when the transistor is in short-circuit operation, i.e. when the transistor operates at a high collector-emitter voltage while a gate-emitter voltage greater than the threshold voltage is applied to the transistor's gate electrode. Such a peak of the electric field can lead to a local breakdown of the semiconductor component and thus to a destruction of the IGBT. Furthermore, a too low electric field at the front side of the drift region (adjoining the MOS channel and the body region) can stimulate the formation of current filaments when the transistor is in short-circuit mode. Such current filaments can lead to local hot-spots and thermal destruction of the IGBT.

SUMMARY

A semiconductor component is described herein. In accordance with one example of the invention, the semiconductor component includes a semiconductor body, which has a top surface and a bottom surface. A body region, which is doped with dopants of a second doping type, is arranged at the top surface of the semiconductor body. A drift region is arranged under the body region and doped with dopants of a first doping type, which is complementary to the second doping type. Thus a first pn-junction is formed at the transition between the body region and the drift region. A field stop region is arranged under the drift region and adjoins the drift region. The field stop region is doped with dopants of the same doping type as the drift region. However, the concentration of dopants in the field stop region is higher than the concentration of dopants in the drift region. At least one pair of semiconductor layers composed of a first and a second semiconductor layer are arranged in the drift region. The first semiconductor layer extends substantially parallel to the top surface of the semiconductor body and is doped with dopants of the first doping type but with a higher concentration of dopants than the drift region. The second semiconductor layer is arranged adjacent to or adjoining the first semiconductor layer and is doped with dopants of the second doping type. Furthermore, the second semiconductor layer is structured to include openings so that a vertical current path is provided through the drift region without an intervening pn-junction.

In accordance with another example of the invention, the semiconductor component comprises a semiconductor body, which has a top surface and a bottom surface. A body region, which is doped with dopants of a second doping type, is arranged at the top surface of the semiconductor body. A drift region is arranged under the body region. The drift region is doped with dopants of a first doping type, which is complementary to the second doping type. Thus a first pn-junction is formed at the transition between the body region and the drift region. A field stop region is arranged under the drift region and adjoins the drift region. The field stop region is doped with dopants of the same doping type as the drift region. However, the concentration of dopants in the field stop region is higher than the concentration of dopants in the drift region. At least one first semiconductor layer is arranged in the drift region. The first semiconductor layer extends substantially parallel to the top surface of the semiconductor body and is doped with dopants of the first doping type but with a higher concentration of dopants than the drift region. Moreover, the first semiconductor layer is located in the upper portion of the drift region, which vertically extends into the semiconductor body not more than 40 percent of the total vertical thickness of the semiconductor body.

BRIEF DESCRIPTION OF THE DRAWINGS

The invention can be better understood with reference to the following drawings and descriptions. The components in the figures are not necessarily to scale; in-stead emphasis is placed upon illustrating the principles of the invention. Moreover, like reference numerals in the figures designate corresponding parts. In the drawings.

DETAILED DESCRIPTION

Figure 1:
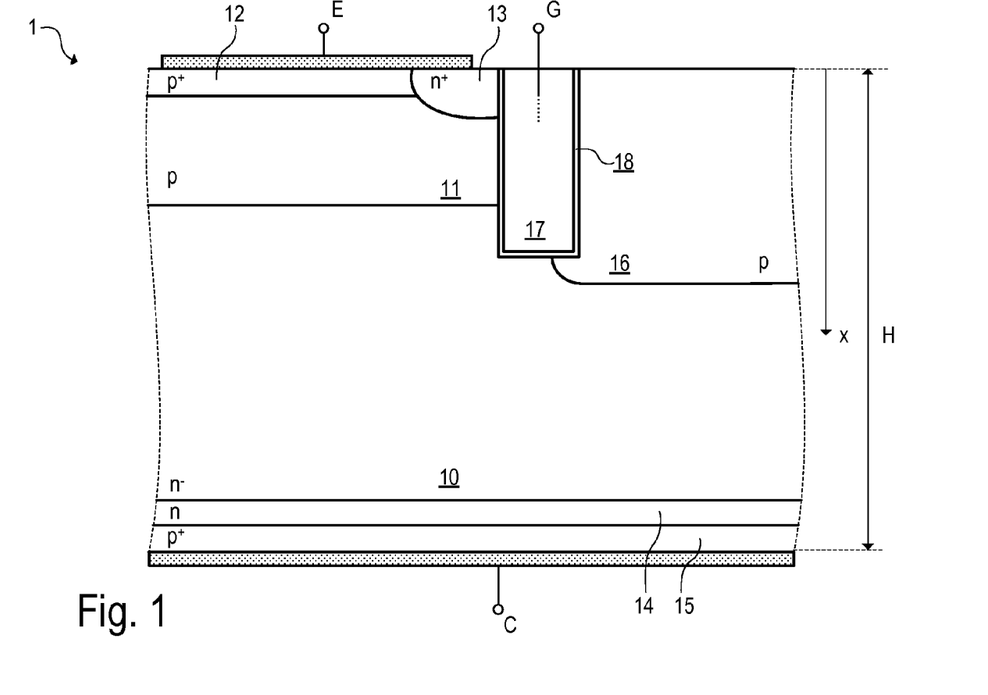
FIG. 1 illustrates a cross sectional view of one example of a conventional insulated gate bipolar transistor (IGBT) cell.

FIG. 1 illustrates one exemplary transistor cell of a vertical n-channel IGBT with a field stop region. In accordance with the present example, the IGBT is integrated in a semiconductor body (substrate) which is doped with n-type dopants. In the present example, the gate electrode G is disposed in a trench 17 which extends from the front side of the semiconductor body in a vertical direction into the semiconductor body. The gate electrode G is isolated from the surrounding semiconductor material by the isolation layer 18 (also referred to as gate oxide).

A p-doped body region 11 is formed at the front side of the semiconductor body. The body region 11 extends vertically into the semiconductor body and adjoins the trench 17. However, the body region 11 does not extend so deep into the semiconductor body as the trench 17. At the top surface (front surface) of the semiconductor body the body region 11 is typically more heavily doped. The heavily doped portion of the body region may be referred as body contact region 12, which is also doped with p-type dopants. An n-doped source region 13 adjoins the top surface (front surface) of the semiconductor body as well as the trench 17, such that the remaining body region lies vertically between the source region 13 and a lowly n-doped drift region 10. The drift region 10 extends through most of the semiconductor body down to its back side, where it adjoins an n-doped field stop region 14 (field stop layer). The field stop region 14 lies between the drift region 10 and a collector region 15, which is doped with p-type dopants and adjoins the back surface of the semiconductor body, where it is electrically contacted by the collector electrode C. The emitter electrode E is electrically connected to the source region 13 and the body contact region 12 thereby short-circuiting the pn-junction between the source region 13 and the body contact region 12.

In case the transistor is off (i.e. when the gate electrode is discharged or at a negative potential with respect to the potential of the body region 11 and a collector-emitter voltage below the breakdown voltage of the transistor is present), a space charge region (or depletion region) builds up at the pn-junction between the body region 11 and the drift region 10. As the drift region has a comparably low concentration of (n-type) dopants (the concentration $N_D$ is labelled n⁻ in the diagram of FIG. 2), the space charge region can extend far into the semiconductor body (depending on the collector-emitter voltage) and may reach down to the field stop layer 14 (sometimes called buffer layer), which has a higher concentration of dopants than the drift region 10 (the concentration $N_D$ is labelled n in the diagram of FIG. 2).

As shown in FIG. 1, on the right side of the trench 17 the transistor cell may have a floating p-region 16 which separates neighboring cells. However, neighboring cells may alternatively be separated by other structures (e.g. inactive trenches) or adjoin each other directly.

Figure 2:
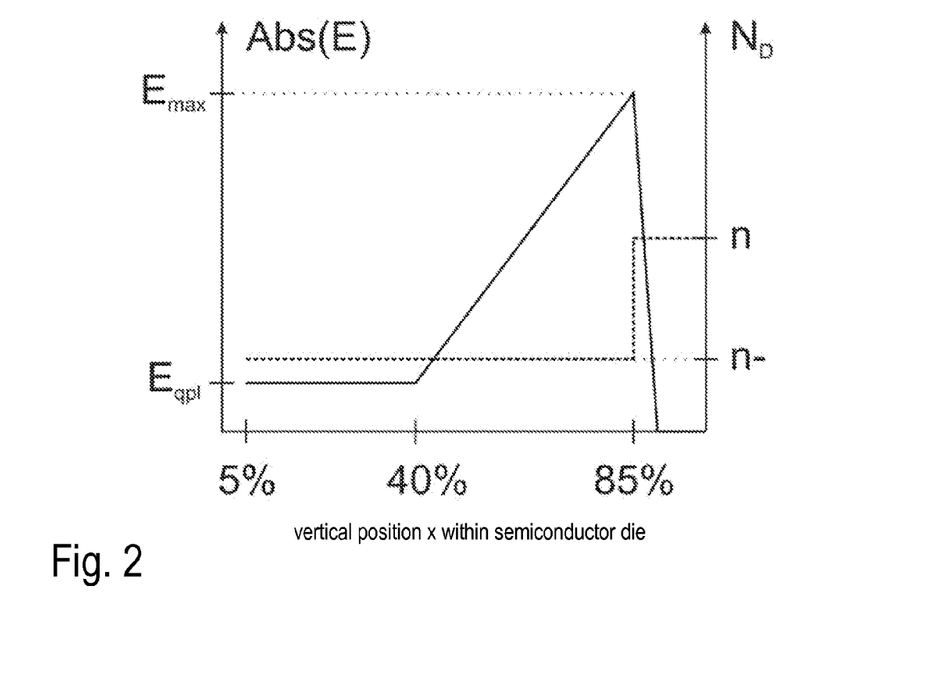
FIG. 2 illustrates schematically the electrical field strength during an exemplary short-circuit operation of a field stop IGBT and the corresponding donor concentration over the vertical position within the IGBT of FIG. 1.

One design goal for IGBTs is robustness against short-circuit events, i.e. when the load connected to the IGBT is short-circuited and thus the full operating voltage is applied between collector and emitter terminal while the transistor is in an on-state. IGBTs can withstand such short-circuit conditions for some time (i.e. a few microseconds). It has been observed that during short-circuit operation a peak of the electric field strength can occur near the margin of the field stop layer 14 which may result in a local breakdown and thus in a destruction of the device (see the example in FIG. 2, peak field strength $E_{max}$ at a vertical position at approximately 85 percent). Furthermore, current filamentation may occur in case the electric field strength (electric field strength $E_{QFL}$) is too low during short-circuit operation in the front of the drift region 10 (i.e. the portion of the drift region 10 adjoining the body region 11, see the example in FIG. 2, vertical position below approximately 40 percent). The maximum electric field strength at the field stop layer 14 can be reduced and the low electric field strength in the front portion of the drift region 10 can be increased by increasing the concentration of p-type dopants in the collector region 15 and/or by reducing the concentration of n-type dopants in the field stop layer 14. However, these measures would entail higher switching losses and a reduced breakdown voltage respectively, which is undesired. Alternatively, the concentration of dopants in the drift region 10 may be increased, which would entail a reduced maximum blocking voltage. It can be seen from the above discussion that there is a conflict of objectives with regard to switching losses, maximum blocking voltage and short-circuit robustness. The examples below may resolve this conflict of objectives or at least improve the situation. In the diagram of FIG. 2 this means that the low electric field strength level at the left side of the diagram is increased and the peak at the right side is reduced, without significantly increasing the losses. In FIG. 2, the position x within the semiconductor body is given in percent of the total thickness H of the semiconductor body (see also FIG. 1).

Figure 3:
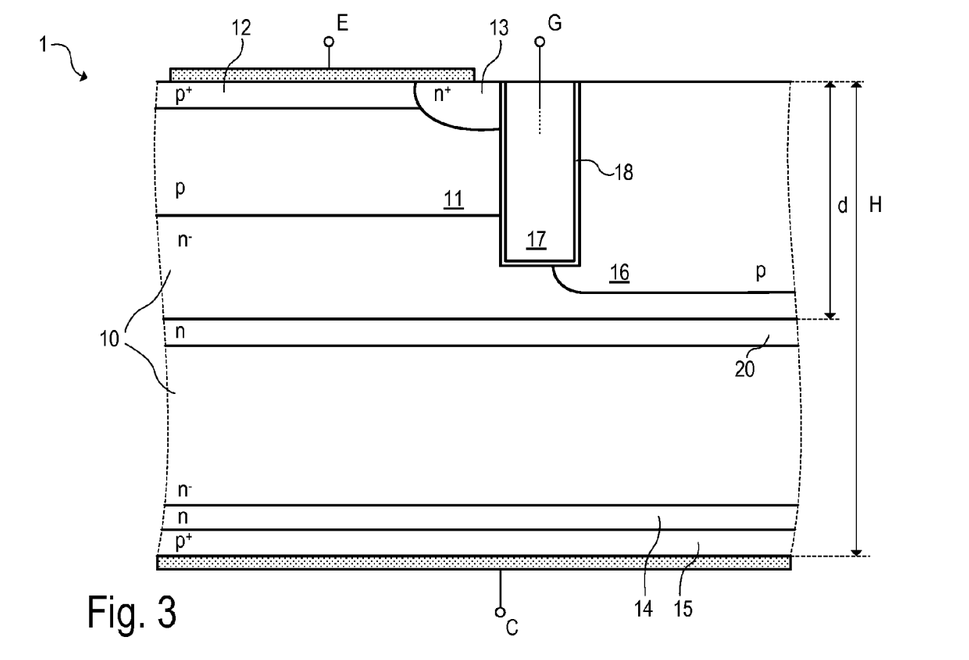
FIG. 3 illustrates a cross sectional view of one example of an IGBT cell including a first doped layer in the drift region, the first doped layer having the same doping type as the drift region but a higher concentration of dopants than the adjoining drift region.
Figure 4:
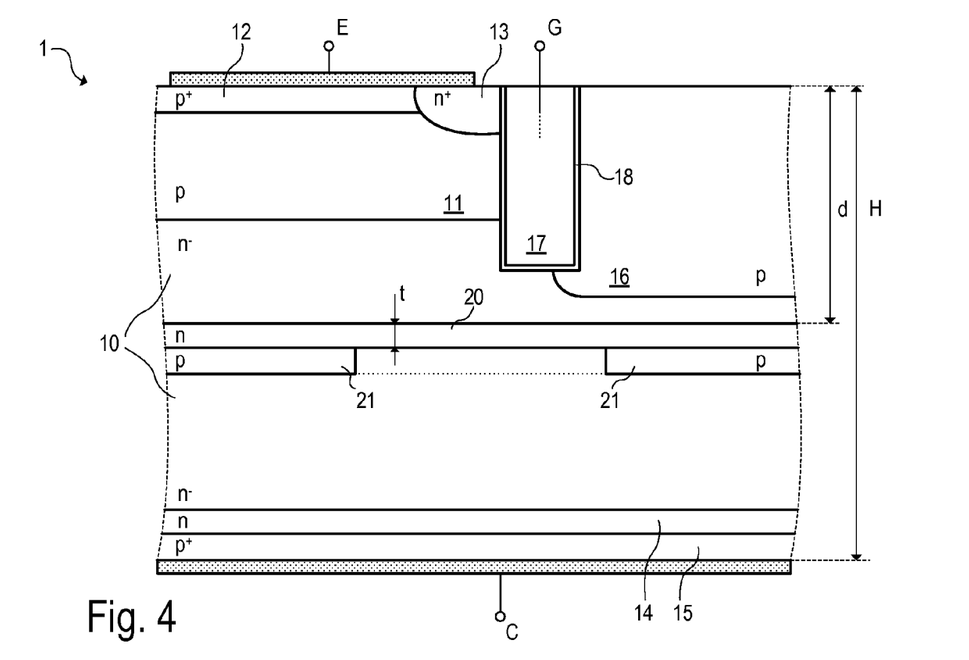
FIG. 4 illustrates an IGBT cell similar to the example of FIG. 3 which has a second doped layer that adjoins the first doped layer and is doped with dopants of the doping type complementary to the doping type of the first doped layer.
Figure 5:
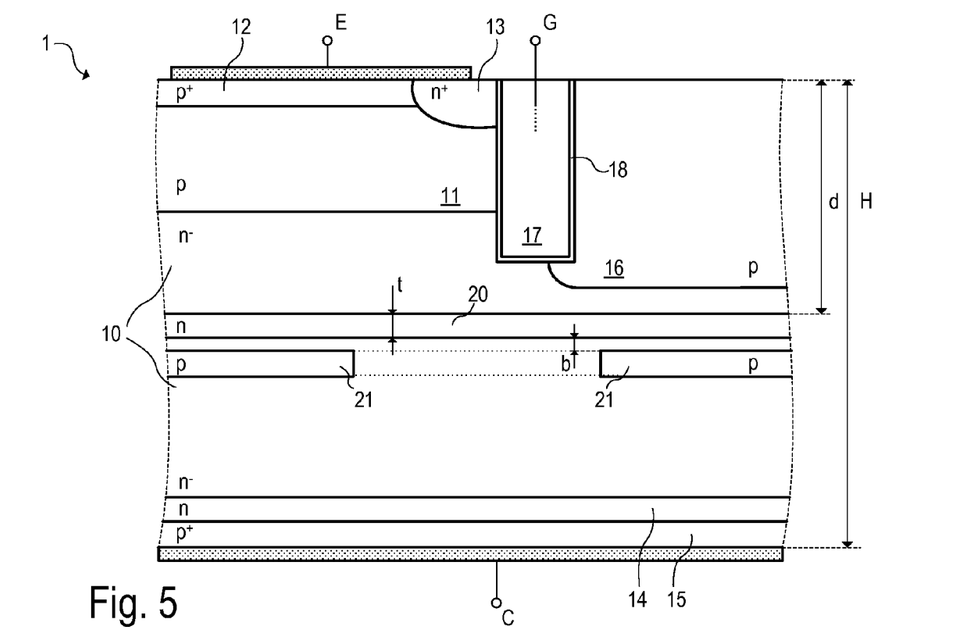
FIG. 5 illustrates a minor modification of the example of FIG. 4.

The example illustrated in FIG. 3 is essentially identical with the previous example of FIG. 1. However, the IGBT has an additional first semiconductor layer 20 arranged in the drift region 10. The first semiconductor layer 20 is doped with dopants of the same doping type as the neighboring drift region 10 (n-type dopants in the present example of an n-channel IGBT). However, the concentration of dopants in the first semiconductor layer 20 is higher than the concentration of dopants in the neighboring drift region 10. The absolute value of the concentration of dopants in the first semiconductor layer 20 depends on the concentration of dopants in the drift region 10. Typically, the dose of dopants in the first semiconductor layer 20 may be chosen between $1 \cdot 10^{11}$ cm⁻² and $1 \cdot 10^{12}$ cm⁻² for a silicon IGBT. During short-circuit operation, the first semiconductor layer 20 arranged in the drift region 10 increases the electrical field in the front portion of the drift region 10 and thus, reduces the peak of the maximum electrical field strength in the transition region between the drift region 10 and the field stop region 14. As a result, the short-circuit robustness is improved. However, the maximum blocking voltage is reduced by the introduction of the first semiconductor layer 20. The latter effect can be compensated for by providing a second semiconductor layer 21, which (directly) adjoins (or is located nearby, closely adjacent to) the first semiconductor layer 20 in the drift region 10. The second semiconductor layer 21 is doped with dopants of the doping type (p-type dopants in the present example) complementarity to the doping type of the first semiconductor layer 20. The resulting IGBT structure is illustrated in FIG. 4. As mentioned, the second semiconductor layer 21 may directly adjoin the first semiconductor layer 20. Alternatively, the first semiconductor layer 20 and the second semiconductor layer 21 may be arranged adjacent to each other, i.e. spaced apart by a comparably small distance b, which is smaller than e.g. two or five times the vertical dimension (thickness t) of the first semiconductor layer 20. The latter example is illustrated in FIG. 5 which is essentially identical to the example of FIG. 4 except that the first and the second semiconductor layer 20, 21 do not adjoin each other but are located in close vicinity at a (vertical) distance b.

In order to achieve the compensating effect of the second semiconductor layer the dose of n-type dopants in the first semiconductor layer 20 and the dose of p-type dopants in the second semiconductor layer 21 does not differ by more than 30 percent.

While the first semiconductor layer 20 may continuously extend (in a horizontal direction) parallel to the top surface of the semiconductor body, the adjoining second semiconductor layer 21 may be structured and include openings to avoid a blocking pn-junction between the first and the second semiconductor layer 20, 21 (or between the second semiconductor layer 21 and the lower part of the drift region 10) throughout the whole semiconductor body which would make the device inoperative. However, the p-type dopants in the second semiconductor layer 21 at least partly compensate for the additional n-type dopants in the first semiconductor layer 20. As a result, the above-mentioned reduction of maximum blocking voltage (breakdown voltage) of the IGBT can be decreased or avoided. In the example of FIG. 4, the second semiconductor layer 21 is arranged below the first semiconductor layer 20, whereas in the alternative example of FIG. 6 the position of the first and second semiconductor layers are interchanged, so that the second semiconductor layer 21 is arranged above the first semiconductor layer 20.

In the examples of FIGS. 3 to 6, the first semiconductor layer 20 is arranged at a distance d from the top surface (front surface) of the semiconductor body. The distance d may range from approximately 5 to 40 percent of the total thickness H (i.e. the distance between the front and back side surface of the semiconductor body). In the examples of FIGS. 2 to 4, the upper one of the first and second semiconductor layers 20, 21 is spaced apart from the bottom of the trench 17. However, the bottom of the trench 17 may also reach down into (or extend through) the semiconductor layer 20 and/or 21.

Figure 6:
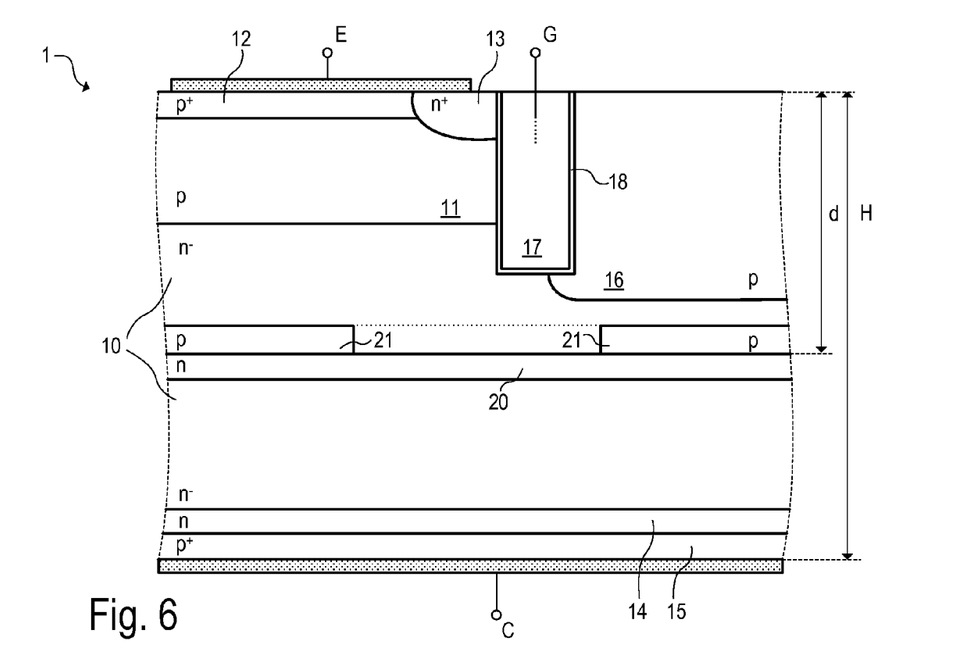
FIG. 6 is identical to the example of FIG. 4 except that the order of the first and the second layer is interchanged.
Figure 7:
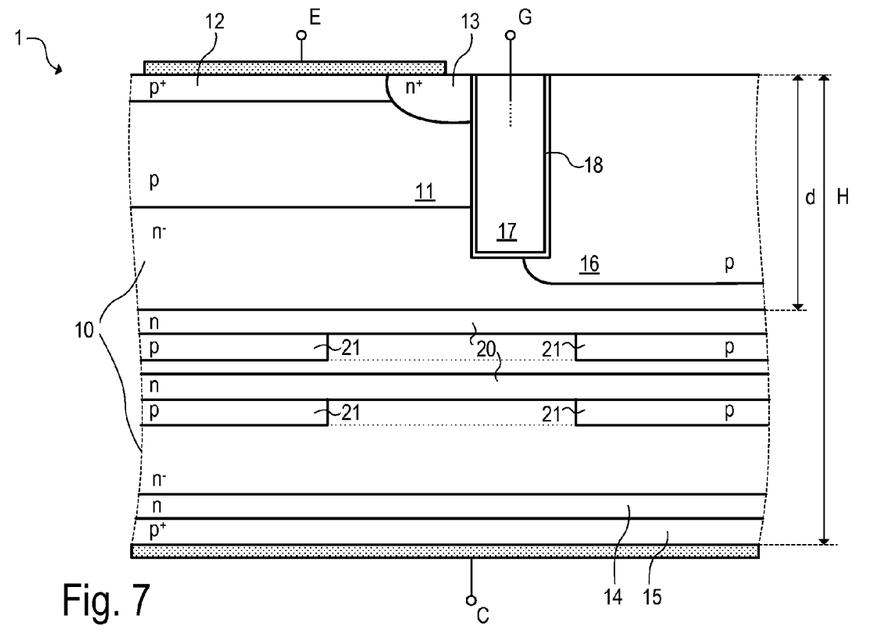
FIG. 7 is similar to the example of FIG. 4 with multiple first and second doped layers arranged in the drift region.

Multiple first and second semiconductor layers 20, 21 may be arranged in the drift region 10 as shown in the example of FIG. 7. In the present example, the p-doped second semiconductor layers 21 are arranged below the corresponding n-doped first semiconductor layers 20, wherein each second semiconductor layer 21 adjoins the corresponding first semiconductor layer 20 or be located at a small distance from it. However, the second semiconductor layers 21 may also be arranged above the corresponding first semiconductor layers as shown in the example of FIG. 6. Neighboring pairs of first and second semiconductor layers 20, 21 may be spaced apart in a vertical direction.

Figure 8:
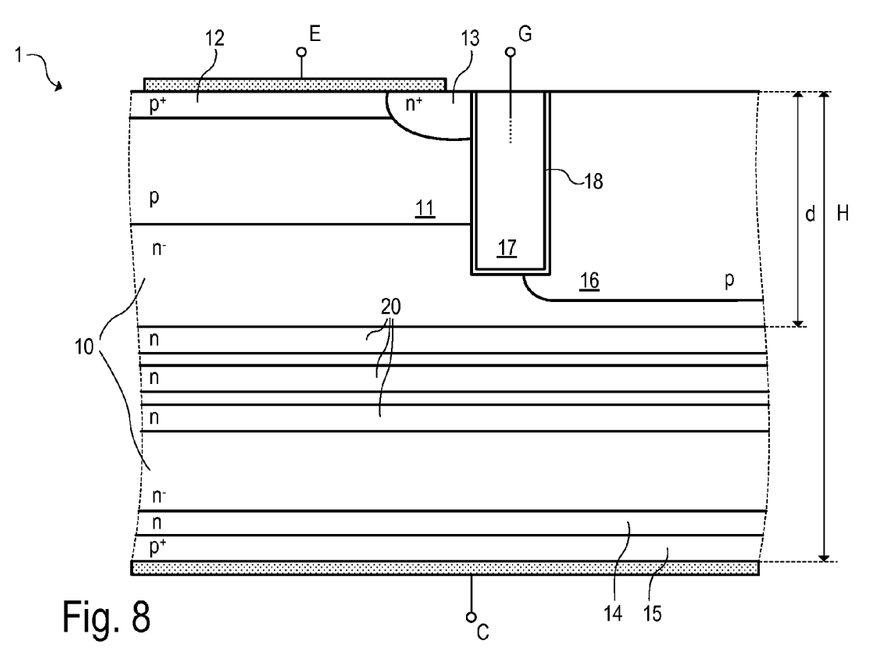
FIG. 8 is similar to the example of FIG. 3 with multiple first doped layers arranged in the drift region.

In the example of FIG. 8, multiple first semiconductor layers 20 are arranged in the drift region 10 and spaced apart from each other in a vertical direction. Similar to the example of FIG. 2, no p-doped second semiconductor layers are provided in this example for compensating for the n-doped first semiconductor layers 20.

Figure 9:
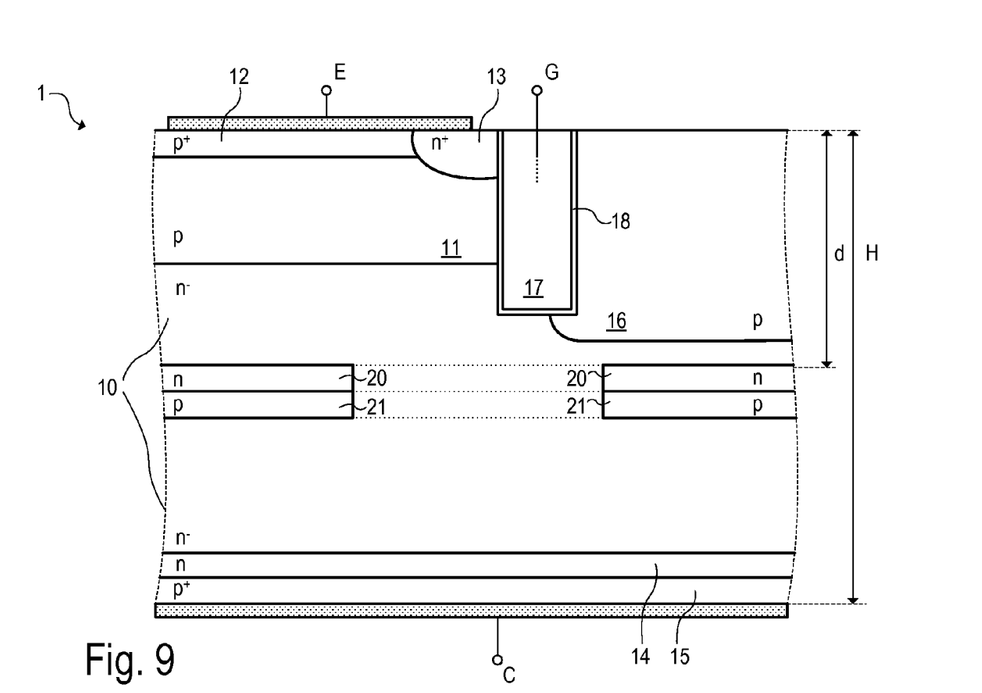
FIG. 9 is to the example of FIG. 4 wherein both, the first and the second doped layers are structured in a lateral direction.

FIG. 9 illustrates a further example of an IGBT cell which is essentially identical with the example of FIG. 4. Different from FIG. 4, however, the first (n-doped) semiconductor layer 20 is structured in a lateral direction in a similar manner as the second (p-doped) semiconductor layer 21. However, the lateral structure (pattern) of the two semiconductor layers 20, 21 is not necessarily the same. In the case of more than two first and second layers (as illustrated in FIGS. 7 and 8) the lateral structure may be the same for all layers. Furthermore, the lateral structure of at least one or all of the first and second semiconductor layers 20, 21 may match (e.g. be congruent with or complementary to) a lateral structure of the back side of the semiconductor body. Examples for a lateral structured back side are a collector region 15 (p-emitter region) with locally enhanced doping concentrations, an interrupted p-emitter region as in reverse conducting IGBTs (also referred to as RC-IGBTs) and a lateral structured field stop region. Finally, the first and second layers 20, 21 may be interrupted (structured to include openings) in the edge region of the chip. The option of a lateral structuring throughout the chip area applies to all embodiments described herein.

Figure 10:
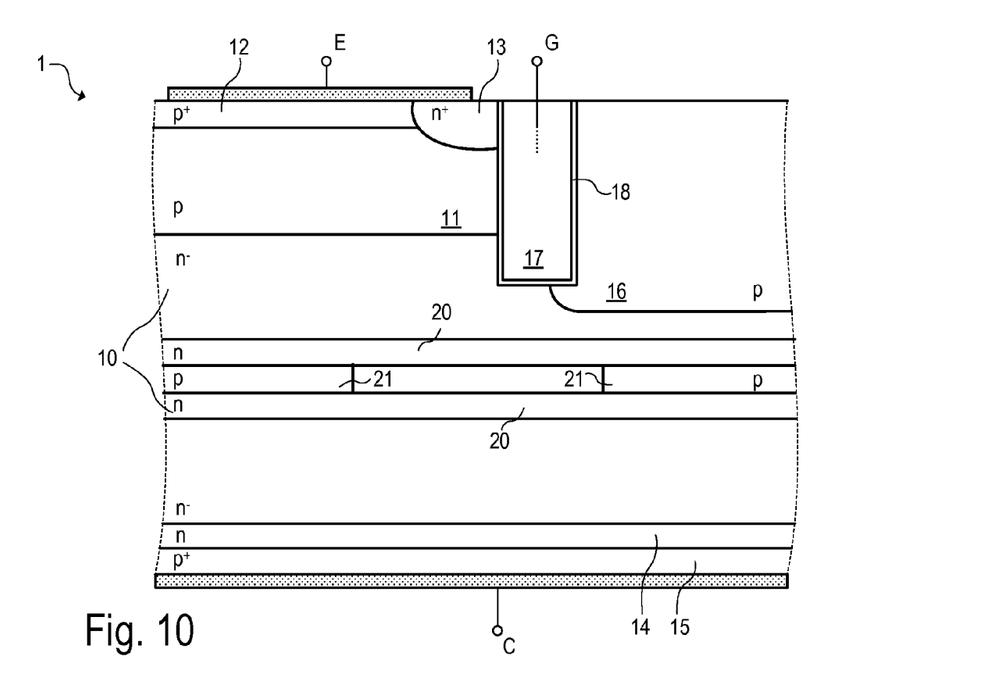
FIG. 10 is a further example which is essentially the same as the example of FIG. 4 with an additional first doped layer.

FIG. 10 illustrates an additional example, which is identical to the example of FIG. 4 except that an additional first semiconductor layer 20 is arranged under the pair of first and second semiconductor layers. This example illustrates that first and second semiconductor layers 20, 21 do not necessarily have to be provided in pairs such as shown in FIG. 7. As an alternative, an additional (structured) p-doped layer 21 could be arranged in the drift zone instead of the n-doped layer 20. That is, pairs of first and second semiconductor layers 20, 21 are provided in the drift zone plus one or more additional n-doped semiconductor layers 20 or one or more additional p-doped semiconductor layers 21. Neighboring layers may adjoin each other (such as shown in FIG. 10) or placed adjacent to each other at a small distance b (such as shown in FIG. 5 or 7).

In the examples described above, the first and second semiconductor layers 20, 21 may be fabricated using epitaxy, proton implantation, ion implantation, diffusion of dopants or any combination thereof. Although the above described examples relate to n-channel IGBTs, the described technical features may also be used in p-channel IGBTs in an analogous manner by using complementary doping types. The principles and technical features described herein may also be applied in reverse conducting IGBTs, which have no continuous p-doped region (collector region or p-emitter region) at the collector side, but additional n-doped stripes. Further, the application to semiconductor components other than IGBTs having a field stop region at their back side may be useful.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application.

Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor component, comprising:
    a semiconductor body having a top surface and a bottom surface;
    a body region doped with dopants of a second doping type arranged at the top surface of the semiconductor body;
    a drift region arranged under the body region, the drift region being doped with dopants of a first doping type complementary to the second doping type thus forming a first pn-junction at a transition between the body region and the drift region;
    a field stop region arranged under the drift region and adjoining the drift region, the field stop region being doped with dopants of the same doping type as the drift region, and the concentration of dopants in the field stop region being higher than the concentration of dopants in the drift region; and
    at least one pair of semiconductor layers composed of a first and a second semiconductor layer arranged in the drift region, the first semiconductor layer extending substantially parallel to the top surface of the semiconductor body and being doped with dopants of the first doping type but with a higher concentration of dopants than the drift region, the second semiconductor layer being in physical contact with the first semiconductor layer and doped with dopants of the second doping type, the second semiconductor layer being structured to include openings so that a vertical current path is provided through the drift region without an intervening pn-junction.

2. The semiconductor component of claim 1, further comprising:
    a collector region arranged between the field stop region and the bottom surface of the semiconductor body, the collector region being doped with dopants of the second doping type.

3. The semiconductor component of claim 1, further comprising:
    a source region embedded in the body region and adjoining the top surface of the semiconductor body, the source region being doped with dopants of the first doping type.

4. The semiconductor component of claim 1, further comprising:
    a gate electrode electrically isolated against the semiconductor body and arranged adjacent to the body region between a source region and the drift region.

5. The semiconductor component of claim 4, wherein the gate electrode is arranged in a trench extending from the top surface of the semiconductor body into the semiconductor body.

6. The semiconductor component of claim 1, wherein the first semiconductor layer of the at least one pair of semiconductor layers is arranged above the second semiconductor layer.

7. The semiconductor component of claim 1, wherein the first semiconductor layer of the at least one pair of semiconductor layers is arranged below the second semiconductor layer.

8. The semiconductor component of claim 1, wherein the first semiconductor layer is located in an upper portion of the drift region.

9. The semiconductor component of claim 8, wherein the upper portion of the drift region vertically extends into the semiconductor body not more than 40 percent of a total vertical thickness of the semiconductor body.

10. The semiconductor component of claim 1, further comprising:
    at least one further pair of semiconductor layers composed of a further first and a further second semiconductor layer arranged in the drift region.

11. The semiconductor component of claim 1, further comprising:
    at least one further first and/or at least one further second semiconductor layer arranged in the drift region.

12. The semiconductor component of claim 1, wherein the first semiconductor layer is substantially parallel to the top surface and located at a distance from the top surface which is approximately between 5 and 40 percent of the thickness of the semiconductor body.

13. The semiconductor component of claim 12, wherein one or more pairs of semiconductor layers are located at the distance from the top surface which is approximately between 5 and 40 percent of the thickness of the semiconductor body.

14. The semiconductor component of claim 1, wherein the first semiconductor layer is substantially parallel to the top surface and located at a distance from the top surface which is approximately between 10 and 30 percent of the thickness of the semiconductor body.

15. The semiconductor component of claim 1, wherein a dose of dopants in the second semiconductor layer does not differ from a dose of dopants in the first semiconductor layer by more than 30 percent.

16. The semiconductor component of claim 1, wherein the at least one pair of first and second semiconductor layers is laterally structured.

17. The semiconductor component of claim 1, wherein the at least one pair of semiconductor layers arranged in the drift region are electrically floating.

* * * * *